(12) United States Patent
Tamaru

(10) Patent No.: US 8,421,125 B2
(45) Date of Patent: Apr. 16, 2013

(54) SEMICONDUCTOR DEVICE WITH DEVIATION COMPENSATION AND METHOD FOR FABRICATING THE SAME

(75) Inventor: Masaki Tamaru, Kyoto (JP)

(73) Assignee: Pansonic Corporation, Osaka (JP)

( * ) Notice: Subject to any disclaimer, the term of this patent is extended or adjusted under 35 U.S.C. 154(b) by 0 days.

(21) Appl. No.: 13/415,493

(22) Filed: Mar. 8, 2012

(65) Prior Publication Data
US 2012/0161241 A1     Jun. 28, 2012

Related U.S. Application Data

(60) Continuation of application No. 12/275,524, filed on Nov. 21, 2008, now Pat. No. 8,198,733, which is a division of application No. 11/444,430, filed on Jun. 1, 2006, now Pat. No. 7,465,656.

(30) Foreign Application Priority Data
Jun. 1, 2005   (JP) ................................. 2005-161265

(51) Int. Cl.
H01L 27/118    (2006.01)
H01L 23/52     (2006.01)
H01L 21/70     (2006.01)
H01L 27/088    (2006.01)
H01L 23/48     (2006.01)
H01L 29/40     (2006.01)

(52) U.S. Cl.
USPC ........... 257/211; 257/206; 257/374; 257/401; 257/758; 257/774; 257/776; 257/E23.143

(58) Field of Classification Search ................... 257/206, 257/211, 374, 401, 774, 776, E23.143, E23.168
See application file for complete search history.

(56) References Cited

U.S. PATENT DOCUMENTS

| 4,221,044 | A |   | 9/1980  | Godejahn et al.           |
|-----------|---|---|---------|---------------------------|
| 4,376,983 | A | * | 3/1983  | Tsaur et al. ....... 365/53 |
| 4,587,711 | A |   | 5/1986  | Godejahn, Jr.             |
| 5,103,287 | A |   | 4/1992  | Mase et al.               |
| 5,425,982 | A |   | 6/1995  | Hara                      |
| 5,604,365 | A | * | 2/1997  | Kajigaya et al. ...... 257/296 |
| 5,677,249 | A |   | 10/1997 | Fukui et al.              |
| 5,796,130 | A | * | 8/1998  | Carmichael et al. ...... 257/206 |

(Continued)

FOREIGN PATENT DOCUMENTS

| JP | 01-214062  | 8/1989 |
| JP | H04-207053 | 7/1992 |
| JP | H06-196479 | 7/1994 |
| JP | 2666325    | 6/1997 |

OTHER PUBLICATIONS

United States Notice of Allowance issued in U.S. Appl. No. 12/275,524 mailed Dec. 14, 2011.
United States Notice of Allowance issued in U.S. Appl. No. 11/444,430 mailed Aug. 14, 2008.

Primary Examiner — Teresa M Arroyo
(74) Attorney, Agent, or Firm — McDermott Will & Emery LLP

(57) ABSTRACT

A semiconductor device includes a conductive pattern formed on a substrate, a conductive land formed to come into contact with at least part of the top surface of the conductive pattern, and a conductive section formed on the conductive land. The conductive section is electrically connected through the conductive land to the conductive pattern.

7 Claims, 5 Drawing Sheets

U.S. PATENT DOCUMENTS

| | | |
|---|---|---|
| 5,798,937 A * | 8/1998 | Bracha et al. .................... 716/54 |
| 5,943,598 A | 8/1999 | Lin |
| 5,985,731 A | 11/1999 | Weng et al. |
| 6,011,276 A | 1/2000 | Yang |
| 6,051,466 A * | 4/2000 | Iwasa ............................ 438/259 |
| 6,069,047 A | 5/2000 | Wanlass |
| RE36,837 E | 8/2000 | Kohyama |
| 6,200,855 B1 | 3/2001 | Lee |
| 6,232,619 B1 * | 5/2001 | Chen et al. ...................... 257/48 |
| 6,373,099 B1 | 4/2002 | Kikuchi et al. |
| 6,437,455 B2 * | 8/2002 | Mori et al. .................... 257/369 |
| 6,479,865 B1 | 11/2002 | Lee et al. |
| 6,596,623 B1 | 7/2003 | Subramanian et al. |
| 6,624,024 B1 | 9/2003 | Prall et al. |
| 6,649,955 B2 | 11/2003 | Lee |
| 6,664,603 B2 * | 12/2003 | Karasawa et al. ............. 257/393 |
| 6,686,288 B1 | 2/2004 | Prall et al. |
| 6,777,735 B2 | 8/2004 | Oh |
| 6,836,019 B2 | 12/2004 | Yang |
| 6,958,541 B2 | 10/2005 | Erickson et al. |
| 2001/0032978 A1 | 10/2001 | Hiromi |
| 2004/0095832 A1 | 5/2004 | Oh |
| 2004/0212017 A1 * | 10/2004 | Mizuno et al. ................ 257/368 |
| 2005/0017284 A1 * | 1/2005 | Amo et al. .................... 257/301 |
| 2005/0017362 A1 | 1/2005 | Erickson et al. |
| 2005/0051814 A1 | 3/2005 | Miyake et al. |
| 2005/0087874 A1 * | 4/2005 | Hieda ........................... 257/751 |
| 2005/0093033 A1 | 5/2005 | Kinoshita et al. |
| 2005/0253269 A1 | 11/2005 | Tsuda |
| 2006/0145286 A1 * | 7/2006 | Ohkawa et al. ............... 257/500 |
| 2007/0066007 A1 | 3/2007 | Vitale et al. |
| 2007/0272992 A1 | 11/2007 | Mori et al. |
| 2010/0052098 A1 | 3/2010 | Miyajima |

\* cited by examiner

SEMICONDUCTOR DEVICE WITH DEVIATION COMPENSATION AND METHOD FOR FABRICATING THE SAME

CROSS-REFERENCE TO RELATED APPLICATIONS

This application is a Continuation of U.S. application Ser. No. 12/275,524 filed on Nov. 21, 2008, now U.S. Pat. No. 8,198,733, which is a Divisional of U.S. application Ser. No. 11/444,430 filed on Jun. 1, 2006, now U.S. Pat. No. 7,465,656, claiming priority of Japanese Patent Application No. 2005-161265 filed on Jun. 1, 2005, the entire contents of each of which are hereby incorporated by reference.

BACKGROUND OF THE INVENTION (1) Field of the Invention

The present invention relates to semiconductor devices and methods for fabricating the same, and more particularly relates to semiconductor devices offering enhanced speed and enhanced degree of integration and methods for fabricating the same.

(2) Description of Related Art

In recent years, with miniaturization in semiconductor process rules, influences exerted by variations in the geometries of large scale integration (LSI) patterns and a deviation from precise alignment of a mask in formation of the LSI patterns have become apparent. This hampers reduction in the area of a semiconductor device. This will be initially described with reference to FIGS. 3A and 3B.

FIG. 3A is a plan view illustrating an exemplary metal oxide semiconductor (MOS) transistor 10 in a known semiconductor device. To be specific, FIG. 3A illustrates patterns of an impurity region 11 formed on a substrate (not shown), gate electrodes 12 partly formed on the impurity region 11, and gate contacts 13 formed on respective parts of the gate electrodes 12 to provide electrical connection with the gate electrodes 12. Although not shown, interconnects are formed on the gate contacts 13.

The patterning accuracy of fine LSI patterns has a ceiling. Therefore, for example, a deviation from the designed value is caused due to variations in the shape of each of the finished gate electrodes 12. Furthermore, a deviation from the designed location of each gate contact 13 relative to associated one of the gate electrodes 12 is to be formed is caused due to a deviation from precise alignment of a mask. To cope with the above, each gate electrode 12 is formed as a pattern having such a shape that includes a land part 12a and a gate body part 12b to compensate for the deviations from the design value and the precise pattern alignment due to the lack of the patterning accuracy of the LSI patterns and provide a margin that ensures electrical connection between the gate electrode 12 and associated one of the gate contacts 13. The size (area) of the land part 12a is large enough to ensure connection with the gate contact 13. Furthermore, the land part 12a is formed apart from the impurity region 11 to prevent an influence from being exerted upon the performance of the MOS transistor 10. A plurality of gate body parts 12b may be connected to a single land part 12a.

In the MOS transistor 10, the distance S1 between the impurity region 11 and each land part 12a is also set to have a margin for compensating for a deviation between the actually finished shape of the MOS transistor 10 and the designed shape thereof due to the lack of the patterning accuracy. Furthermore, the margin S2 between the land part 12a and associated one of the gate contacts 13 is also set large enough to compensate for a deviation from design due to the lack of the patterning accuracy.

A deviation from the designed value due to the lack of the patterning accuracy, the distance S1 and the margin S2 will be described hereinafter with reference to FIG. 3B.

FIG. 3B illustrates a state in which in formation of MOS transistors 10 including an impurity region 11, gate electrodes 12 and gate contacts 13 as illustrated in FIG. 3A, a deviation from design due to the lack of the patterning accuracy is very noticeably caused.

First, parts of the gate electrodes 12 corresponding to the corners thereof when viewed in plan are rounded by the phenomenon called rounding so as to be formed into shapes in which the outlines of the gate electrodes 12 are deviated from the designed outlines thereof (finished shapes 22). More particularly, the finished shapes 22 are as follows: Outwardly extending ones of the corners of the gate electrodes 12 are rounded to have outlines located inside the outline of the designed patterns when viewed in plan. On the other hand, inwardly extending ones of the corners of the gate electrodes 12 are rounded to outwardly project beyond the designed patterns when viewed in plan. As a result, part of each gate body part 12b located in the vicinity of the land part 12a has a longer gate length than the other part thereof.

Such a rounding phenomenon is remarkably caused, for example, in cases where a pattern to be formed has a complicated shape and where the density of patterns significantly varies across the substrate surface.

In FIG. 3B, a deviation S3 from precise alignment of each gate electrodes 12a relative to the impurity region 11 (hereinafter, referred to as "alignment deviation S3") causes that the distance S4 between the impurity region 11 and each land part 12a after finishing becomes smaller than the distance S1 in FIG. 3A.

In a case where the distance S4 after finishing becomes too small, this causes that part of each gate body part 12b having a longer gate length than the other part thereof due to rounding is located on the impurity region 11. In this case, the MOS transistor 10 has a different gate length from a designed gate length. This affects the performance of the so-constructed MOS transistor. The MOS transistor 10 is designed under consideration of the finished shape 22 and the alignment deviation S3. This prevents part of each gate electrode 12 extending beyond the designed outline of the gate electrode 12 due to rounding of the finished shape 22 from overlapping with the impurity region 11 even when the above-mentioned effect is produced to the maximum extent possible. This is achieved by setting the designed distance S1 between the impurity region 11 and the land part 12a in FIG. 3A large enough (to provide a margin for compensating for deviations).

In FIG. 3B, a deviation from the designed location of each gate contact 13 relative to the associated land part 12a (for example, a deviation S5 from the designed location of the gate contact 13 (hereinafter, referred to as "contact location deviation S5")) and any other deviation are also caused. When the corners of the land part 12a are rounded due to rounding to a large extent and the contact location deviation S5 becomes large, there is a possibility that the gate contact 13 could not remain within the land part 12a (the contact 13 may be only partly formed on the land part 12a). This causes variations in resistance and disconnection. To cope with this, the margin S2 illustrated in FIG. 3A is set large enough to prevent the gate contact 13 from being only partly formed on the land part 12a even when the influence of the deviation between the finished shape 22 of the gate electrode 12 and the designed shape thereof due to rounding is produced to the maximum extent (in other words, the margin S2 is set to be large enough).

Next, FIGS. 4A and 4B illustrate an example of a technique for reducing the margin for alignment between a gate electrode and a contact providing connection with an impurity diffusion region in a known semiconductor device (hereinafter, referred to as "impurity diffusion region contact").

FIG. 4A is a plan view illustrating a known semiconductor device to which a technique for forming a self-aligned contact hole has been applied. The semiconductor device includes impurity regions 41 formed in the upper portion of a substrate (not shown) and forming source and drain regions, gate electrodes 42 formed on the impurity regions 41, and an impurity region contact 43 for providing electrical connection with one of the impurity regions 41. FIG. 4B is a cross-sectional view taken along the line IVb-IVb' in FIG. 4A.

In FIGS. 4A and 4B, each of gate electrodes 42 is formed on a substrate 40 with associated one of gate insulating films 44 interposed therebetween, and impurity regions 41 are formed in parts of the substrate 40 located to both sides of the gate electrode 42. A protective insulating film 47 is formed on the gate electrode 42, and sidewalls 46 are formed on both sides of a set of the gate electrode 42 and the protective insulating film 47. The gate electrode 42 and some other elements are covered with an interlayer insulating film 45. An opening is formed to pass through the interlayer insulating film 45, and an impurity region contact 43 for providing connection with the impurity region 41 is formed to fill the opening.

With the above-mentioned structure, even when the location at which the impurity region contact 43 is formed relative to the gate electrode 42 is deviated from the designed location, the protective insulating film 47 formed on the gate electrode 42 prevents electrical shorting between the gate electrode 42 and the impurity region contact 43. Therefore, margins for variations in the accuracy of the alignment between the gate electrode 42 and the impurity region contact 43 and variations in the accuracy of the size of the finished gate electrode 42 and the finished impurity region contact 43 do not need to be provided. As a result, the distance between the gate electrode 42 and the impurity region contact 43 is reduced, thereby increasing the degree of integration of an LSI. This technique is disclosed, for example, in Japanese Patent Publication No. 2666325 (in particular, page 4, FIG. 1).

FIG. 5 illustrates the state of a known semiconductor device in which lower interconnects 51 (51a, 51b, 51c, and 51d) for element-to-element connection (hereinafter, referred to as "element-to-element connection lower interconnects 51") and upper interconnects 53 (53a and 53b) for element-to-element connection (hereinafter, referred to as "element-to-element connection upper interconnects 53") located above the element-to-element connection lower interconnects 51 are provided and the element-to-element connection lower interconnects 51 are connected through vias 52 (52a and 52b) to the element-to-element connection upper interconnects 53. More particularly, a via 52a is formed to come into contact with the top surface of a part of an element-to-element connection lower interconnect 51b, and further an element-to-element connection upper interconnect 53a is formed to come into contact with the top surface of the via 52a. In this way, the element-to-element connection lower interconnect 51b is electrically connected to the element-to-element connection upper interconnect 53a. Likewise, an element-to-element connection lower interconnect 51d is electrically connected through a via 52b to an element-to-element connection upper interconnect 53b.

Also when the vias 52 are formed to achieve the above-mentioned structure, the locations at which the vias 52 are actually formed may deviate from predetermined locations at which the vias 52 are to be formed. As a result, the element-to-element connection lower interconnects 51 are at risk of being prevented from ensuring electrical connection with the vias 52. To avoid this, it should be considered that as in the case of the gate electrodes illustrated in FIG. 3A, parts of the element-to-element connection lower interconnects 51 are enlarged so as to be formed into land parts. However, the distance S50 between any adjacent two of the element-to-element connection lower interconnects 51 is specified as the patternable minimum interconnect-to-interconnect distance. Therefore, the width of each element-to-element connection lower interconnect 51 cannot be set arbitrarily. In view of the above, the element-to-element connection lower interconnect 51 cannot be arbitrarily provided with a land part.

To cope with this, for example, as illustrated in FIG. 5, the via 52a is formed a predetermined distance S51, i.e., a margin, behind one end of the element-to-element connection lower interconnect 51b. In other words, the element-to-element connection lower interconnect 51b is formed to outwardly project the distance S51 beyond the via 52a. When the distance S51 is thus long enough, this can prevent the via 52a from being apart from the top surface of the element-to-element connection lower interconnect 51b in the longitudinal direction thereof even with a deviation from the designed location of the via 52a. The distance S52 between the element-to-element connection lower interconnects 51b and 51d is specified as the patternable minimum interconnect-to-interconnect distance.

For this structure, no margin is provided to compensate for deviations from the designed locations of the vias 52a in the direction orthogonal to the longitudinal direction of the element-to-element connection lower interconnect 51b. However, since a margin is provided along at least one direction (the longitudinal direction of the element-to-element connection lower interconnect 51b), the known semiconductor device is designed to ensure electrical connection between the element-to-element connection lower interconnect 51b and the via 52a.

SUMMARY OF THE INVENTION

However, the known semiconductor device has the following problems.

In the known semiconductor device illustrated in FIGS. 3A and 3B, the distance S1 between the impurity region 11 and each land part 12a (the designed distance therebetween) is determined while the characteristics of the MOS transistor are prevented from being affected by the alignment deviation S3 and rounding. In other words, also when the rounding and the alignment deviation S3 have the maximum influence on the characteristics of the MOS transistor, the designed distance S1 is set to keep the distance S4 long enough to prevent a part of a gate electrode having a different gate length from a designed gate length due to rounding from being located on the impurity region 11. As process rules become finer and finer, margins for the above-mentioned two factors have come to have an unignorable influence on the LSI area (i.e., the margins have come to increase the LSI area).

Likewise, the margin S2 between each land part 12a and associated one of the gate contacts 13 is set to prevent the associated gate contact 13 from being only partly formed on the land part 12a and being apart from the land part 12a even when the contact location deviation S5 in the location of the associated gate contact 13 relative to the land part 12a and a deviation between the finished shape of each gate electrode 12 and the designed shape thereof are produced to the maximum extent. In other words, as in the above-mentioned case, margins for two factors, i.e., the contact location deviation S5 and rounding, are provided. As process rules become finer and finer, margins for the above-mentioned two factors have come to have an unignorable influence on the LSI area (i.e., the margins have come to increase the LSI area).

In the case of the known semiconductor device illustrated in FIGS. 3A and 3B, the alignment deviation S3 and the contact location deviation S5 both depend on the alignment accuracy of an exposure device. Therefore, even if the patterning technique for LSI patterns is improved, it is difficult to reduce the alignment margin for compensating for the alignment deviation S3 and the contact location deviation S5 unless the exposure device is improved.

Furthermore, in FIGS. 3A and 3B, also when rounding and the alignment deviation S3 are caused to the maximum extent, the distance S4 necessary for preventing the characteristics of the MOS transistor from being affected depends on the patterning technique for LSI patterns. Likewise, when the finished shape 22 of each gate electrode 12 is formed so that its outline becomes closer to the center of associated one of the land parts 12 than that of the designed pattern thereof to the maximum extent, a distance S6 for forming the whole of the contact 13 on the land part 12a also depends on the patterning technique for LSI patterns.

As process rules become finer, the degree of difficulty in patterning has been increasing. Therefore, it cannot necessarily be expected that the patterning accuracy will be improved as necessary for an arbitrary LSI pattern. This makes it difficult to reduce the margin and provides an obstacle to reduction in the LSI area.

The self-alignment technique for the known semiconductor device illustrated in FIGS. 4A and 4B is a technique for coping with a deviation from precise alignment between the gate electrodes 42 and the impurity region contact 43. This technique cannot be applied to deviations from proper alignment between the impurity regions 41 and the gate electrodes 42 and between the gate electrodes 42 and gate contacts (not shown).

As illustrated in FIG. 5, the element-to-element connection lower interconnects 51 need to be formed to outwardly project the predetermined distance S51 beyond the vias 52. This increases the distance between the element-to-element connection lower interconnects 53 and also provides an obstacle to reduction in the LSI area.

In view of the above problems, the present invention provides a semiconductor device corresponding to fine process rules and more particularly achieves an increase in the degree of integration of LSIs and a reduction in the LSI area by reducing the margin required according to the patterning accuracy. Simultaneously, the speed at which the LSIs operate and the reliability of the LSIs are increased. This will be sequentially described hereinafter.

A semiconductor device of the present invention includes: a conductive pattern formed on a substrate; a conductive land formed to come into contact with at least part of the top surface of the conductive pattern; and a conductive section formed on the conductive land, the conductive section being electrically connected through the conductive land to the conductive pattern.

According to the semiconductor device of the present invention, margins required for the conductive pattern are reduced, thereby reducing the LSI area. In addition, the patterning accuracy for the conductive pattern can be improved, and the finished size of the conductive pattern can be stabilized. The reasons for the above are as follows.

In the known semiconductor device, a conductive section for providing electrical connection with a conductive pattern has been formed to come into direct contact with the conductive pattern. In view of a deviation from precise alignment between the conductive pattern and the conductive section and variations in the finished shape of the conductive pattern due to rounding, the conductive pattern has been formed to have a margin large enough to prevent the conductive section from being located outside the conductive pattern.

On the other hand, in the semiconductor device of the present invention, electrical connection between the conductive pattern and the conductive section is provided through the conductive land formed on the conductive pattern. More particularly, even with a deviation between the location where the conductive pattern is formed and the location where the conductive section is formed, the conductive land is formed so as to be connected to both the conductive pattern and the conductive section. This allows electrical connection between the conductive pattern and the conductive section. This eliminates the need that the conductive pattern should have a margin in view of a deviation from precise alignment between the conductive pattern and the conductive section. As a result, the LSI area can be reduced.

To be specific, for example, it becomes unnecessary that a part of the conductive pattern on which the conductive section is formed is formed into a land part that is wider than the other part of the conductive pattern and the land part has a size including a margin for rounding caused by the lack of the patterning accuracy. Therefore, the area that has been needed to form the land part is reduced in the semiconductor device of the present invention.

Furthermore, the shape of the conductive pattern when viewed in plan can be simplified, and the density difference across the substrate surface can be reduced. This can reduce the influence of rounding. As a result, the patterning accuracy for the conductive pattern can be improved, and the finished size of the conductive pattern can be stabilized.

Furthermore, in the known art, the land part that is wider than the other part of the conductive pattern is limited in placement. As a result, the location where the contact is formed may have been limited. For example, the land part cannot be formed on the impurity region. On the other hand, since in the semiconductor device of the present invention the conductive land is formed to come into contact with the top surface of the conductive pattern, this eases limitations on the placement of the conductive land when viewed in plan. This enhances the flexibility of layout. For example, the conductive land of the present invention can be located on the impurity region. In view of the above, the area of the semiconductor device can be reduced, and the degree of integration of the semiconductor device can be increased.

It is preferable that the conductive land extends over the top surface of the conductive pattern and an area around said top surface and has a larger area than the conductive section when viewed in plan.

More particularly, since the conductive land extends over the conductive pattern and an area around the conductive pattern, it has a larger area than a part of the top surface of the conductive pattern coming into contact with the conductive land. The conductive part is formed on the above-mentioned conductive land to have a smaller area than the conductive land.

Thus, when the conductive pattern and the conductive land are formed without any margin for coping with the lack of the patterning accuracy and a deviation from precise alignment, electrical connection between the conductive pattern and the conductive land is certainly provided.

The semiconductor device of the present invention may further include an impurity region formed in the upper portion of the substrate and a gate insulating film formed on the impurity region, wherein the conductive pattern may be a gate electrode formed on the impurity region with the gate insulating film interposed therebetween, the conductive land may be a local interconnect coming into contact with at least part of the top surface of the gate electrode, and the conductive section may be a contact formed on the local interconnect.

Thus, in a semiconductor device having a MOS transistor including a gate insulating film and a gate electrode, the effects of the semiconductor device of this embodiment can be achieved. Margins for the gate electrode and the contact, i.e., the formation of the land part and consideration for rounding, are eliminated, resulting in a reduction in the LSI area. Furthermore, electrical connection between the gate electrode and the contact is certainly provided.

Furthermore, a part of a gate electrode that is wider than the other part thereof has conventionally been formed into a land part to provide connection with a contact. Such a land part has been needed to be located outside an impurity region. In view of the above, a region of the gate electrode on which the contact can be formed has been limited in location.

On the other hand, in the case of the present invention in which a local interconnect is formed to come into contact with the top surface of the gate electrode and a contact is formed on the local interconnect, the contact can be formed on the impurity region. This enhances the flexibility of layout, such as the flexibility of the location where the contact is formed. As a result, the degree of integration of a semiconductor device can be increased, and the area thereof can be reduced.

It is preferable that another gate electrode is formed in a layer in which the gate electrode is formed. Furthermore, it is preferable that the gate electrode and said another gate electrode are electrically connected to each other by bringing at least part of the top surface of said another gate electrode into contact with the local interconnect.

In order to provide electrical connection among a plurality of gate electrodes, an interconnect portion has conventionally been formed in a layer in which the plurality of gate electrodes are formed. This complicates the shape of a pattern including the plurality of gate electrodes and the interconnect portion and reduces the patterning accuracy due to rounding. A margin has been needed in compensation of a reduction in patterning accuracy.

On the other hand, when electrical connection among a plurality of gate electrodes is provided through a local interconnect, this eliminates the need for forming an interconnect portion in a layer in which a plurality of gate electrodes are formed. Therefore, the shape of a pattern formed in the layer in which the plurality of gate electrodes are formed is simplified, thereby suppressing rounding. As a result, the need for forming a margin can be reduced, leading to a reduction in the LSI area. This is achieved independent of whether a gate contact is formed on the local interconnect.

In the present invention, in order to provide connection among the plurality of gate electrodes, contacts can be formed on the plurality of gate electrodes, respectively, and an interconnect can be formed to cover the contacts. In this case, a margin for compensating for a deviation from precise alignment is however required. This leads to the problem to be solved by the present invention.

The local interconnect preferably reinforces electrical characteristics of the gate electrode by extending over the gate electrode.

With this structure in which the local interconnect extends over the gate electrode, for example, even when the gate electrode is broken or even when the resistance of part of the gate electrode is increased, current can be certainly passed through the local interconnect. This can achieve a reduction in the resistance of a gate electrode interconnect and an increase in the reliability thereof. Furthermore, the reliability of a miniaturized LSI whose degree of integration is increased and that has a gate electrode and the speed at which such a LSI operates can be increased.

Next, in the semiconductor device of the present invention, the conductive pattern may be an element-to-element connection interconnect, the conductive land may be a local interconnect coming into contact with at least part of the top surface of the element-to-element connection interconnect, and the conductive section may be a via formed on the local interconnect.

The element-to-element connection interconnect herein means an interconnect for providing electrical connection between elements, such as MOS transistors formed at the substrate.

Thus, for the element-to-element connection interconnect and the via for providing electrical connection with the element-to-element connection interconnect, margins for coping with the lack of the patterning accuracy and a deviation from precise alignment are reduced. Furthermore, electrical connection between the element-to-element connection interconnect and the via is certainly provided through the local interconnect. In this way, the LSI area can be reduced with the reliability of electrical connection between the element-to-element connection interconnect and the via maintained.

Moreover, the flexibility of the location of a part of the element-to-element connection interconnect on which the via is formed is enhanced, leading to a reduction in the area of a semiconductor device and an increase in the degree of integration thereof.

It is preferable that another element-to-element connection interconnect is formed in a layer in which the element-to-element connection interconnect is formed. Furthermore, it is preferable that the element-to-element connection interconnect and said another element-to-element connection interconnect are electrically connected to each other by bringing at least part of the top surface of said another element-to-element connection interconnect into contact with the local interconnect.

Thus, as in the case where a plurality of gate electrodes are electrically connected through a local interconnect to one another, the need for providing margins for the plurality of element-to-element connection interconnects is eliminated. Consequently, while electrical connection among the plurality of element-to-element connection interconnects is certainly provided, the LSI area can be reduced.

The local interconnect preferably reinforces the element-to-element connection interconnect by extending over the element-to-element connection interconnect.

With this structure in which the local interconnect extends over the element-to-element connection interconnect, for example, even when the element-to-element connection interconnect is broken or even when the resistance of part of the element-to-element connection interconnect is increased, current can be certainly passed through the local interconnect. This can achieve a reduction in the resistance of the element-to-element connection interconnect and an increase in the reliability thereof. Furthermore, the reliability of a miniaturized LSI whose degree of integration is increased and that has an element-to-element connection interconnect and the speed at which such a LSI operates can be increased.

Next, a method for fabricating a semiconductor device will be described.

A method for fabricating a semiconductor device of the present invention includes the steps of: forming a conductive pattern on a substrate; forming a conductive land to come into contact with at least part of the top surface of the conductive pattern; and forming a conductive section on the conductive land, the conductive section being electrically connected through the conductive land to the conductive pattern.

According to the fabrication method for a semiconductor device of the present invention, the semiconductor device according to the present invention can be fabricated. More particularly, the formation of the conductive land ensures electrical connection between the conductive pattern and the conductive section. In addition, for the conductive pattern and the conductive land, margins for compensating for the lack of the patterning accuracy and deviations from precise alignment are not required. A semiconductor device that achieves a reduction in its area can be fabricated. Since the shape of the conductive pattern does not need to be determined under consideration of a margin, this can simplify the shape of the conductive pattern and reduce the influence of rounding. Therefore, the patterning accuracy for the conductive pattern can be improved, and the finished size of the conductive pattern can be stabilized.

Furthermore, limitations on the location at which the conductive section is formed are eased. This enhances the flexibility of layout. As a result, the area of a semiconductor device can be reduced, and the degree of integration thereof can be increased.

It is preferable that the conductive land extends over the top surface of the conductive pattern and an area around said top surface and has a larger area than the conductive section when viewed in plan.

Thus, when a conductive pattern and a conductive land are formed without any margin for compensating for the lack of the patterning accuracy and a deviation from precise alignment, electrical connection between the conductive pattern and the conductive land can be certainly provided.

The method of the present invention may further include the step of before the step of forming the conductive pattern, forming an impurity region on the substrate and forming a gate insulating film on the impurity region. A gate electrode is preferably formed, as the conductive pattern, on the impurity region with the gate insulating film interposed between the gate electrode and the impurity region, a local interconnect is preferably formed, as the conductive land, to come into contact with at least part of the top surface of the gate electrode, and a contact is preferably formed, as the conductive section, on the local interconnect to provide electrical connection with the gate electrode.

Thus, when a semiconductor device including a MOS transistor having an impurity region, a gate insulating film and a gate electrode and other elements is fabricated, electrical connection between the gate electrode and a contact can be certainly provided, and a semiconductor device having a reduced area can be fabricated.

An element-to-element connection interconnect is preferably formed as the conductive pattern, a local interconnect is preferably formed, as the conductive land, to come into contact with at least part of the top surface of the element-to-element connection interconnect, and a via is preferably formed, as the conductive section, on the local interconnect, to provide electrical connection with the element-to-element connection interconnect.

Thus, for the element-to-element connection interconnect and the via for providing electrical connection with the element-to-element connection interconnect, margins for coping with the lack of the patterning accuracy and a deviation from precise alignment are eliminated. Furthermore, electrical connection between the element-to-element connection interconnect and the via can be certainly provided through the local interconnect. In this way, a semiconductor device reduced in area can be fabricated.

As described above, according to the present invention, electrical connection between the conductive pattern and the conductive section is provided through the conductive land. This can eliminate the need for margins provided for the conductive pattern and the conductive section to cope with the lack of the patterning accuracy and deviations from precise alignment. This can simplify the shape of the conductive pattern and enhance the patterning accuracy and reliability. Furthermore, the flexibility of the location where the conductive section is formed is enhanced.

Consequently, a semiconductor device is achieved which allows a reduction in its area and an increase in its degree of integration while maintaining its reliability, and such a semiconductor device can be fabricated.

BRIEF DESCRIPTION OF THE DRAWINGS

FIGS. 1A through 1D are diagrams illustrating the structure of a semiconductor device according to a first embodiment of the present invention, in which FIG. 1A is a plan view of the semiconductor device and FIGS. 1B, 1C and 1D are cross-sectional views thereof.

FIGS. 2A through 2C are diagrams illustrating the structure of a semiconductor device according to a second embodiment of the present invention, in which FIG. 2A is a plan view of the semiconductor device and FIGS. 2B and 2C are cross-sectional views thereof.

FIGS. 4A and 4B are diagrams illustrating the structure of another known semiconductor device, in which FIG. 4A is a plan view of another known semiconductor device and FIG. 4B is a cross-sectional view thereof.

DETAILED DESCRIPTION OF THE INVENTION (Embodiment 1)

A semiconductor device according to a first embodiment of the present invention will be described hereinafter with reference to the drawings. First, the structure of the semiconductor device will be described.

Figure 1A:
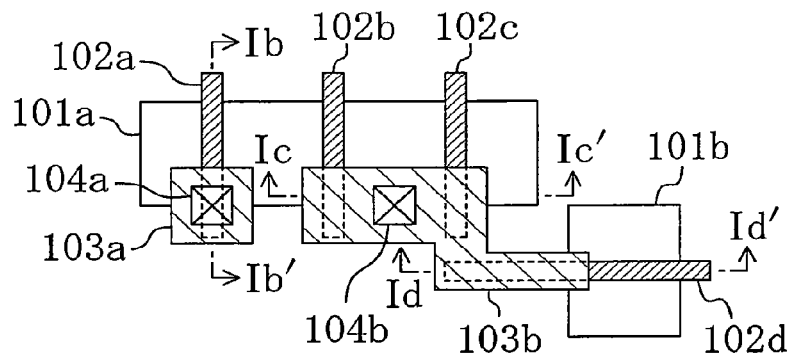
Figure 1B:
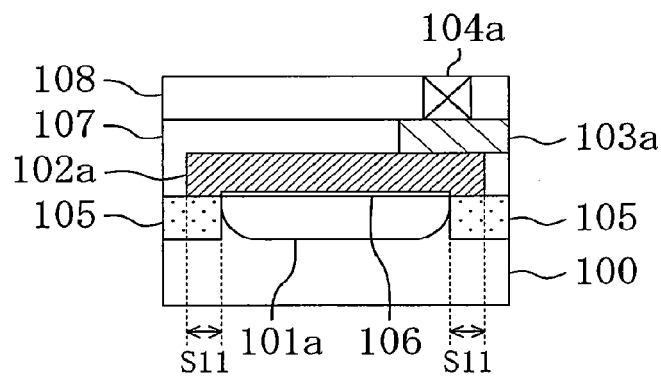
Figure 1C:
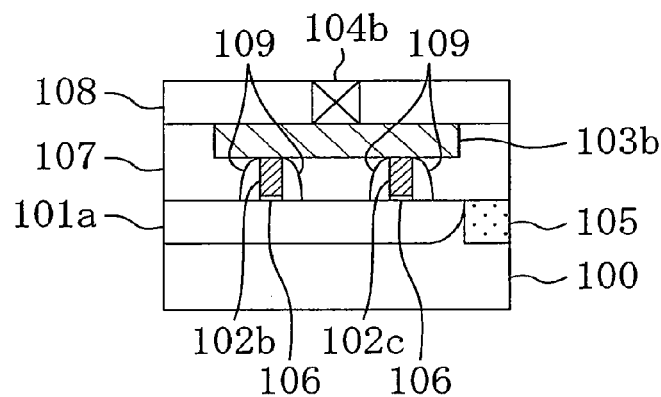
Figure 1D:
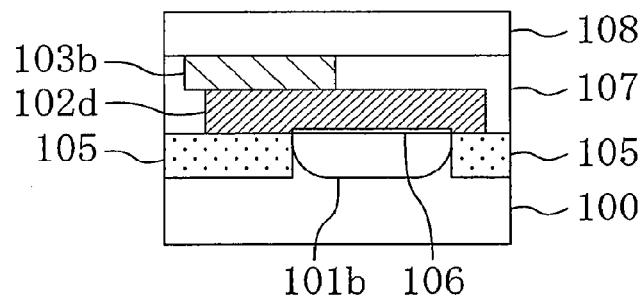

FIGS. 1A through 1D are schematic views illustrating the structure of the semiconductor device according to this embodiment. More particularly, FIG. 1A is a plan view illustrating only some of the components forming the semiconductor device of this embodiment, and FIGS. 1B, 1C, and 1D are diagrams illustrating cross sections taken along the lines Ib-Ib', Ic-Ic', and Id-Id' in FIG. 1A, respectively.

First, a plan structure of the semiconductor device including MOS transistors will be described with reference to FIG. 1A.

In FIG. 1A, impurity regions 101 formed of source/drain regions of MOS transistors (the combination of a first impurity region 101a and a second impurity region 101b is referred to as "impurity regions 101") are formed in the upper portion of a substrate (not shown). A plurality of source/drain contacts (not shown) are formed on each impurity region 101 to provide electrical connection between an interconnect layer (not shown) and the impurity region 101. The source/drain contacts are buried contacts made of, for example, tungsten.

A plurality of gate electrodes 102 are formed on the impurity regions 101 with a gate insulating film (not shown) interposed therebetween. More particularly, a first gate electrode 102a, a second gate electrode 102b, and a third gate electrode 102c are formed on the first impurity region 101a, and a fourth gate electrode 102d is formed on the second impurity region 101b. The combination of the first through fourth gate electrodes 102a through 102d is referred to as "gate electrodes 102". The gate electrodes 102 are made of, for example, polysilicon.

Local interconnects 103 are formed to come into contact with at least respective parts of the top surfaces of the gate electrodes 102. To be more specific, a first local interconnect 103a is formed on the first gate electrode 102a, and a single common second local interconnect 103b is formed on the second, third and fourth gate electrodes 102b, 102c and 102d to come into contact with at least respective parts of the top surfaces of the second, third and fourth gate electrodes 102b, 102c and 102d. The combination of the first and second local interconnects 103a and 103b is referred to as "local interconnects 103".

A first gate contact 104a is formed on the first local interconnect 103a, and a second gate contact 104b is formed on the second local interconnect 103b. These gate contacts 104 (the combination of the first and second gate contacts 104a and 104b is referred to as "gate contacts 104") are formed, for example, by filling an opening formed in an interlayer dielectric (not shown) with tungsten.

Furthermore, although not shown, an interconnect layer is formed on the gate contacts 104.

Next, a cross-sectional structure of the semiconductor device of this embodiment will be described. As illustrated in FIGS. 1B, 1C and 1D, the semiconductor device of this embodiment is formed using a substrate 100. First, regions of the substrate 100 defined by an isolation region 105 thereof form impurity regions 101. The isolation region 105 is made of, for example, $SiO_2$.

Gate insulating films 106 of, for example, SiON are formed on each impurity region 101. Furthermore, gate electrodes 102 are formed on the impurity regions 101 with the gate insulating films 106 interposed therebetween to project beyond both sides of the impurity regions 101. To be specific, for example, as illustrated in FIG. 1B, a first gate electrode 102a is formed on the impurity region 101a to project a distance S11 beyond each of the lateral sides of the impurity region 101a.

As illustrated in FIG. 1C, sidewalls 109 of, for example, $SiO_2$ are formed on both sides of each gate electrode 102 in the gate length direction.

A first interlayer dielectric 107 is formed to cover the substrate 100, the isolation region 105, the impurity regions 101, and other elements. The gate electrodes 102, the sidewalls 109, and the local interconnects 103 are formed so as to be embedded in the first interlayer dielectric 107. Furthermore, a second interlayer dielectric 108 is formed on the first interlayer dielectric 107, and gate contacts 104 are formed so as to be embedded in the second interlayer dielectric 108.

The first gate electrode 102a is electrically connected through a first local interconnect 103a to a first gate contact 104a. A second gate electrode 102b, a third gate electrode 102c, and a fourth gate electrode 102d are electrically connected through a second local interconnect 103b to a second gate contact 104b.

The above-mentioned structure reduces the margin required in the known art to compensate for a deviation from precise alignment and variations in the finished shape of a gate electrode. This will be specifically described hereinafter.

Figure 3A:
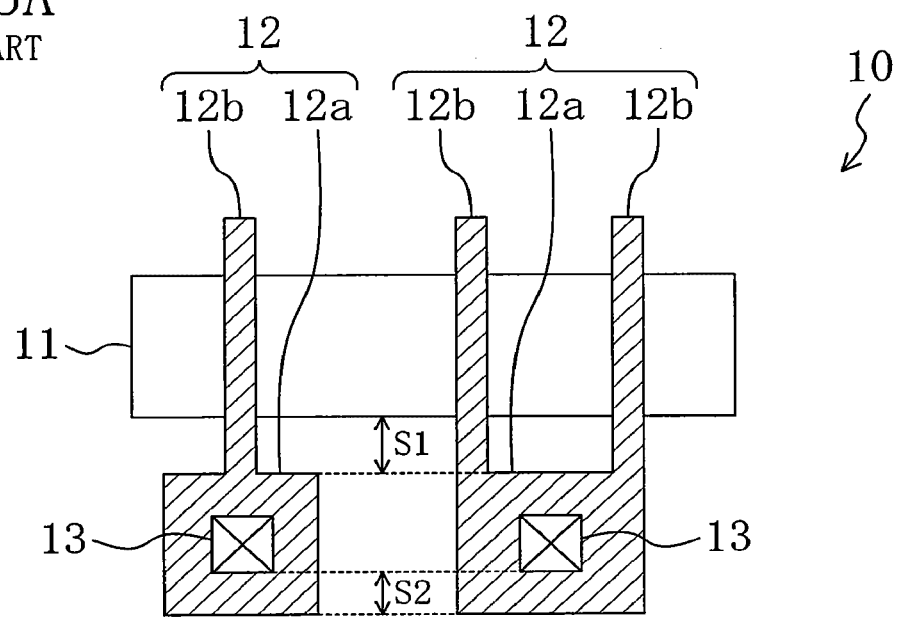
FIGS. 3A and 3B are plan views illustrating the structure of a known semiconductor device.
Figure 3B:
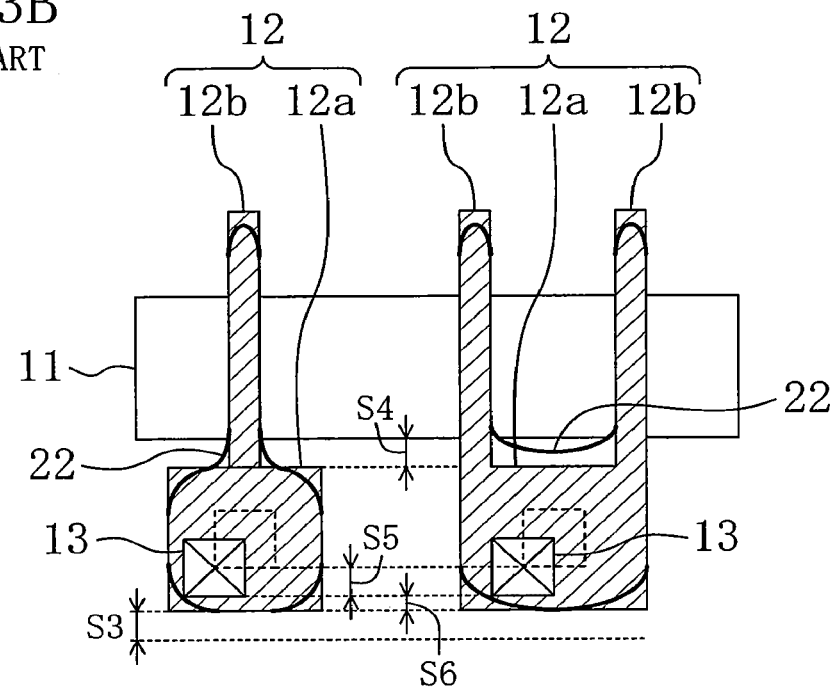
Figure 4A:
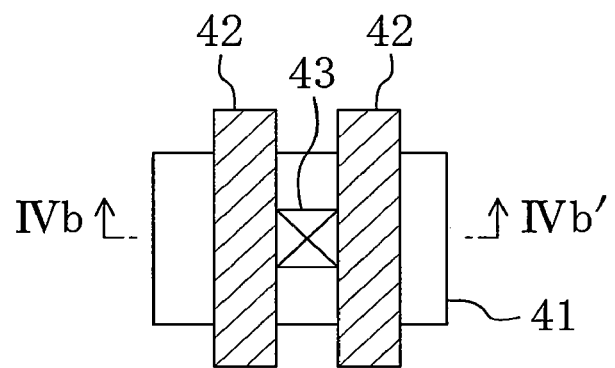
Figure 4B:
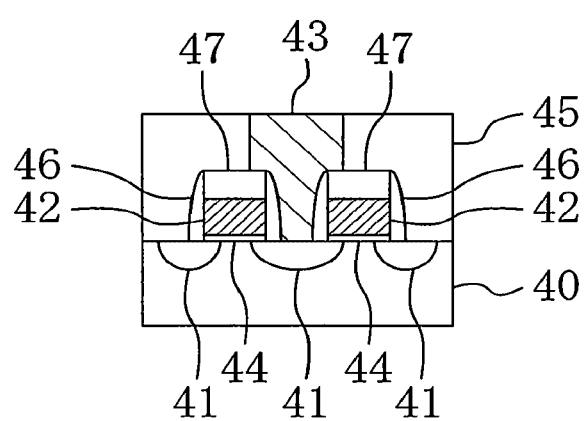

In the known art, as illustrated in FIGS. 3A and 3B, gate electrodes has been formed as flat patterns each having a land part to compensate for a deviation from precise alignment and ensure electrical connection between the gate electrodes and gate contacts.

On the other hand, for the semiconductor device of this embodiment, the gate electrodes 102 are electrically connected through the local interconnects 103 to the gate contacts 104. Each local interconnect 103 has a larger area than the contact area between the local interconnect 103 and associated one of the gate electrodes 102 and has a larger area than the surface area of associated one of the gate contacts 104. This ensures electrical connection between the gate electrodes 102 and the gate contacts 104 even with a deviation from precise alignment.

This provides the following results. First, each gate electrode 102 does not need to have a land part for certainly providing connection with associated one of the gate contacts 104, resulting in a reduction in the area of the gate electrode 102. Second, as illustrated in FIG. 1A, the gate electrode 102 can have a simple structure that only allows the gate electrode 102 to function as a gate electrode of a MOS transistor.

Furthermore, for the known art illustrated in FIG. 3A and other figures, part of a gate electrode located in the vicinity of a land part thereof is increased in gate length due to rounding. Therefore, an impurity region and the land part have needed to be sufficiently spaced. To cope with this, in addition to the margin for compensating for a deviation from precise alignment of the gate electrode relative to the impurity region and variations in the finished shape of the gate electrode due to rounding, another margin has been required.

For the semiconductor device of this embodiment, such a margin is not necessary, because each gate electrode 102 does not have any land part. Consequently, for example, the distance S11 by which the first gate electrode 102a projects beyond the first impurity region 101a as illustrated in FIG. 1B is determined mainly according to how much the actual outline of the first gate electrode 102a is located inside the designed outline thereof due to rounding and a deviation from precise alignment of the first gate electrode 102a relative to the first impurity region 101a. The so-determined margin is reduced as compared with the margin that has been required in the known art.

In the known art, it has been necessary that the land part provided with each gate electrode be formed outside associated one of the impurity regions. This places constraints on locations where gate contacts are formed.

However, such constraints do not exist in the semiconductor device of this embodiment. To be specific, for example, the first local interconnect 103a may be formed on the first impurity region 101a to overlap with the first impurity region 101a when seen in plan, and the first gate contact 104a may also be formed on the first local interconnect 103a. It is also possible to extend the first local interconnect 103a and, for example, form a gate contact 104 on the isolation region 105. Thus, flexibility in locations where gate contacts 104 are to be formed is increased. This facilitates increasing the degree of integration of circuits.

As described above, the local interconnects 103 are partly formed on the gate electrodes 102, and the gate contacts 104 are formed on the local interconnects 103. In this way, while electrical connection between the gate electrodes 102 and the gate contacts 104 is certainly provided, the degree of integration of LSIs can be increased and the LSI area can be reduced.

As illustrated in FIGS. 1A and 1C, in the semiconductor device of this embodiment, the second gate electrode 102b and the third gate electrode 102c are electrically connected through the second local interconnect 103b to each other. Furthermore, the second gate contact 104b is formed on the second local interconnect 103b.

In the known art, in a case where a plurality of gate electrodes are electrically connected to each other as described above, patterns forming the plurality of gate electrodes each having a shape including an interconnect for connection between the plurality of gate electrodes have been formed. In FIGS. 3A and 3B, land parts 12a function also as such interconnects. However, as already described, provision of land parts with gate electrodes necessitates margins for compensating for variations in the finished shape of each gate electrode and a deviation from precise alignment due to rounding. Furthermore, locations where the land parts are to be formed are limited. For example, the land parts cannot be formed on the impurity regions.

On the other hand, for the semiconductor device of this embodiment, the second gate electrode 102b and the third gate electrode 102c are electrically connected through the second local interconnect 103b to each other. This eliminates the need for providing land parts or the like with the gate electrodes 102 for the purpose of connecting the gate electrodes and reduces the margin required due to the provision of the land parts. In addition, flexibility in locations where gate contacts 104 are to be formed is increased.

Since a plurality of gate electrodes 102 are thus electrically connected through a local interconnect 103 to one another, the gate electrodes 102 do not need to each have a part for connection among the gate electrodes 102. This can increase the degree of integration of LSIs and reduce the LSI area.

Even when gate electrodes 102 are formed on a plurality of impurity regions 101 formed away from one another, respectively, the gate electrodes 102 can be electrically connected through associated one of local interconnects 103 to one another. For example, in FIGS. 1A and 1D, the third gate electrode 102c formed on the first impurity region 101a and the fourth gate electrode 102d formed on the second impurity region 101b are electrically connected through the second local interconnect 103b to each other. In this way, a plurality of MOS transistors each having one of impurity regions 101 and one of gate electrodes 102 can be electrically connected through associated one of local interconnects 103 to one another.

Patterns forming gate electrodes whose parts will become interconnects for connection among the gate electrodes have conventionally been formed to provide electrical connection among a plurality of MOS transistors. Therefore, the shapes of such patterns become complicated, and the finished shapes of the gate electrodes are likely to vary due to rounding. Margins for compensating for the variations have been required.

On the other hand, since in the semiconductor device of this embodiment some of a plurality of gate electrodes 102 are electrically connected through associated one of local interconnects 103 to one another, this can simplify the shape of each gate electrode and reduce the density difference across the substrate surface. This reduces the influence of rounding. As a result, the need for the margins is eliminated. Also when gate contacts 104 are not formed, an effect is achieved which is obtained by electrically connecting some of the gate electrodes 102 through associated one of the local interconnects 103 to one another.

In order to provide electrical connection among the plurality of gate electrodes 102, contacts can be formed on the gate electrodes 102, for example, the second gate electrode 102b and the third gate electrode 102c, respectively, and an interconnect can be formed to cover these contacts. In this case, the problem to be solved by the present invention, such as a deviation from precise alignment of the contacts relative to the gate electrodes 102, is however caused. On the other hand, when a local interconnect 103 is formed as an interconnect coming into contact with the top surfaces of some of the plurality of gate electrodes 102, this can reduce the influence of rounding and deviations from precise alignment, resulting in a reduced margin and thus a reduced LSI area.

As illustrated in FIGS. 1A and 1D, the second local interconnect 103b is formed to extend over part of the fourth gate electrode 102d. Since conductive local interconnects 103 thus overlap with the top surfaces of gate electrodes 102, this achieves the effect of reinforcing the gate electrodes 102, more specifically, the effect of reducing the resistance of each gate electrode 102 and increasing the reliability thereof.

It is also possible that a plurality of gate electrodes 102 are formed with their parts that will become interconnects for connection among the plurality of gate electrodes 102 as in the known art and local interconnects 103 are formed to extend over the top surfaces of parts of the gate electrodes 102 including the parts of the gate electrodes 102 that will become interconnects. Also in this case, the use of the local interconnects 103 achieves a reduction in the resistance of each gate electrode 102 and an increase in the reliability thereof. For example, even when parts of the gate electrodes 102 that will become interconnects for connection among the plurality of gate electrodes 102 are broken, electrical connection thereamong can be maintained.

As described above, according to the semiconductor device of this embodiment, gate electrodes 102 do not need to have land parts and parts that will become interconnects among the gate electrodes 102. This simplifies the shape of each gate electrode 102 and reduces the difference in pattern density across the substrate surface. Furthermore, electrical connections between the gate electrodes 102 and associated gate contacts and among the gate electrodes 102 are certainly provided through the local interconnects 103. In view of the above, margins for compensating for deviations from precise alignment and variations in the finished shape of each gate electrode 102 due to rounding are reduced.

Furthermore, in the known art, gate contacts must be formed on land parts of gate electrodes whose locations are limited as follows: The gate contacts cannot be formed on the impurity regions. On the other hand, local interconnects 103 can be formed on the impurity regions. As a result, the gate contacts 104 can also be formed on the impurity regions 101, and flexibility in the locations where the gate contacts 104 are to be formed is increased.

Since the local interconnects 103 are formed to extend over the top surfaces of the gate electrodes 102, this can achieve a reduction in the resistance of each gate electrode 102 and an increase in the reliability thereof.

In view of the above, the degree of integration of LSIs is increased, the LSI area is reduced, and the reliability of LSIs is increased. This leads to an increase in the speed at which LSIs operate. The structure of the semiconductor device of this embodiment in which such local interconnects 103 are provided may be applied to the whole of a single semiconductor device or combined with the structure of the known semiconductor device (in which no local interconnect is provided). The local interconnects may be used only to provide electrical connection among gate electrodes 102 or only to reinforce the gate electrodes 102.

Next, a fabrication method for a semiconductor device according to this embodiment will be described with reference to FIGS. 1A through 1D. First, an isolation region 105 is formed in the upper portion of a substrate 100 by selective oxidation or any other method in a known lithography process. Next, a gate insulating film 106 and a conductive film are sequentially stacked on the substrate 100, and then gate electrodes 102 are formed through a lithography process.

Next, an insulating film is formed on the substrate 100 by chemical vapor deposition (CVD) or any other method to cover impurity regions 101 of the substrate 100 and the gate electrodes 102 and then subjected to anisotropic etching, thereby forming sidewalls 109. Thereafter, impurity regions 101 are formed as source/drain regions of MOS transistors by implantation of ions into the substrate 100 using the gate electrodes 102 and the sidewalls 109 as masks or any other method.

Subsequently, a first interlayer dielectric 107 is formed on the substrate 100 by CVD or any other method, and then openings are formed in the first interlayer dielectric 107 to form local interconnects 103. Next, the openings are filled with a metal for forming interconnects, such as tungsten, thereby forming local interconnects 103.

Subsequently, a second interlayer dielectric 108 is formed by CVD or any other method to cover the first interlayer dielectric 107 and the local interconnects 103. Next, openings are formed in the second interlayer dielectric 108 by lithography or any other method to form gate contacts 104. Thereafter, the openings are filled with a refractory metal, such as tungsten, thereby forming gate contacts 104.

While openings are formed in the second interlayer dielectric 108 to form gate contacts 104, openings are formed also in the first and second interlayer dielectrics 107 and 108 to form source/drain contacts (not shown) for providing electrical connection with the impurity regions 101. The gate contacts 104 and the source/drain contacts are simultaneously formed by filling the openings with tungsten or any other metal.

In this manner, the semiconductor device of this embodiment as illustrated in FIGS. 1A through 1D is fabricated.

(Embodiment 2)

Figure 2A:
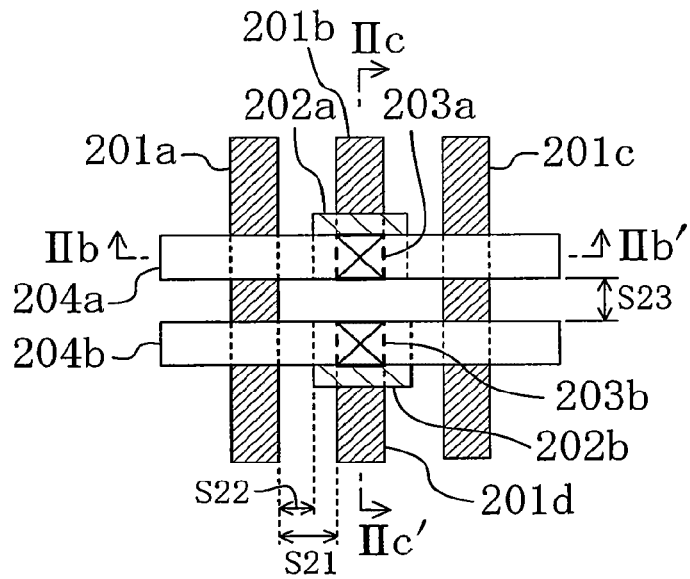
Figure 2B:
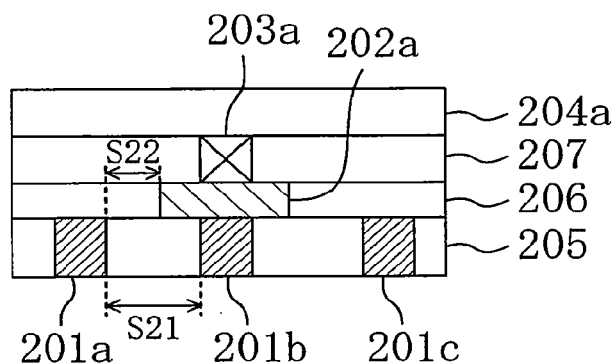
Figure 2C:
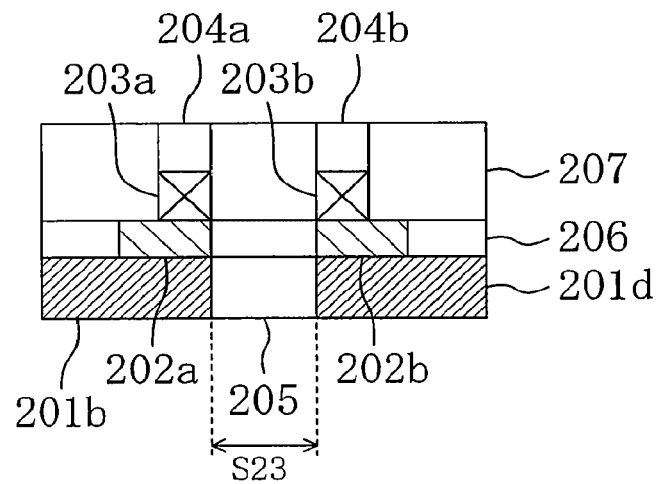

Next, a semiconductor device according to a second embodiment of the present invention will be described. FIGS. 2A through 2C are schematic views illustrating the structure of the semiconductor device according to this embodiment. More particularly, FIG. 2A is a plan view illustrating only some of the components forming the semiconductor device of this embodiment, and FIGS. 2B and 2C are diagrams illustrating cross sections taken along the lines IIb-IIb' and IIc-IIc' in FIG. 2A, respectively.

In the semiconductor device of this embodiment, as illustrated in FIGS. 2A through 2C, four element-to-element connection lower interconnects 201 (the combination of element-to-element connection lower interconnects 201a, 201b, 201c, and 201d is referred to as "element-to-element connection lower interconnects 201") and element-to-element connection upper interconnects 204 located above the element-to-element connection lower interconnects 201 (the combination of element-to-element connection upper interconnects 204a and 204b is referred to as "element-to-element connection upper interconnects 204") are provided.

Among the element-to-element connection lower interconnects 201, the element-to-element connection lower interconnects 201b and 201d are aligned in series such that their associated ends are opposed to each other so as to be spaced a predetermined distance apart from each other. The element-to-element connection lower interconnects 201a and 201c are spaced a predetermined distance S21 apart from the element-to-element connection lower interconnects 201b and 201d with the element-to-element connection lower interconnects 201b and 201d interposed therebetween.

An element-to-element connection upper interconnect 204a is oriented orthogonal to the element-to-element connection lower interconnect 201b and located on one end of the element-to-element connection lower interconnect 201b. Likewise, an element-to-element connection upper interconnect 204b is oriented orthogonal to the element-to-element connection lower interconnect 201d and located on one end of the element-to-element connection lower interconnect 201d.

Local interconnects 202a and 202b (the combination of the local interconnects 202a and 202b is referred to as "local interconnects 202") are formed on the element-to-element connection lower interconnects 201b and 201d, respectively. Furthermore, vias 203a and 203b (the combination of the vias 203a and 203b is referred to as "vias 203") are formed on the local interconnects 202a and 202b, respectively. The top surfaces of the vias 203a and 203b are connected to the bottom surfaces of the element-to-element connection upper interconnects 204a and 204b, respectively.

In this way, the element-to-element connection lower interconnect 201b is electrically connected through the local interconnect 202a and the via 203a to the element-to-element connection upper interconnect 204a. Likewise, the element-to-element connection lower interconnect 201d is electrically connected through the local interconnect 202b and the via 203b to the element-to-element connection upper interconnect 204b.

The element-to-element connection lower interconnects 201, the vias 203 and the element-to-element connection upper interconnects 204 are all made of copper. The local interconnects 202 are formed of tungsten. The materials of the above-mentioned interconnects are not limited.

The element-to-element connection lower interconnects 201 are formed so as to be embedded in a first interlayer dielectric 205, the local interconnects 202 are formed so as to be embedded in a second interlayer dielectric 206, and the vias 203 and the element-to-element connection upper interconnects 204 are formed so as to be embedded in a third interlayer dielectric 207. However, the first, second and third interlayer dielectrics are not shown in FIG. 2A.

As illustrated in FIGS. 2A and 2B, the distance S21 between adjacent ones of the element-to-element connection lower interconnects 201 (for example, the element-to-element connection lower interconnects 201a and 201b) is the patternable minimum interconnect-to-interconnect distance. The distance S22 between the element-to-element connection lower interconnect 201a and the local interconnect 202a is one that does not allow contact between the element-to-element connection lower interconnect 201a and the local interconnect 202a and thus does not cause a short circuit therebetween even when a deviation from precise alignment is caused in the formation of the element-to-element connection lower interconnect 201a.

The above-described semiconductor device of this embodiment achieving an increase in the degree of integration of LSIs and a reduction in the LSI area will be described hereinafter.

Figure 5:
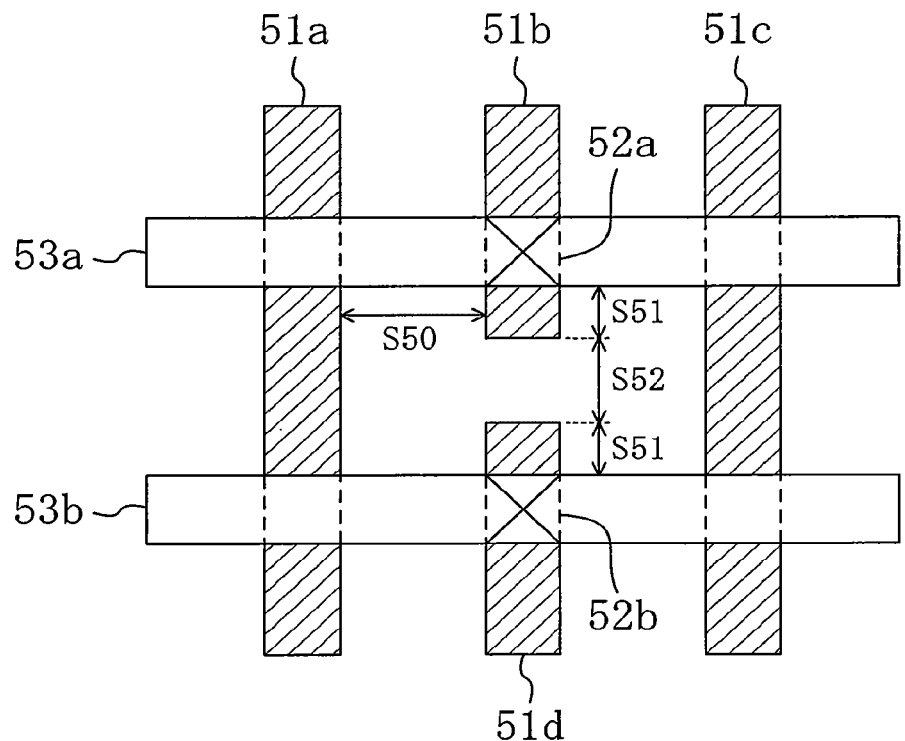
FIG. 5 is a plan view illustrating the structure of still another known semiconductor device.

In the known art, as illustrated in FIG. 5, each of vias has been formed directly on associated one of element-to-element connection lower interconnects. In order to compensate for a deviation from precise alignment, the via is formed a predetermined distance behind one end of the associated element-to-element connection lower interconnect.

On the other hand, according to the semiconductor device of this embodiment, as illustrated in FIGS. 2A and 2B, the local interconnect 202a is formed to extend over the element-to-element connection lower interconnect 201b and an area around the element-to-element connection lower interconnect 201b (along the line IIb-IIb' in FIG. 2A) when seen in plan. The via 203a is formed on the local interconnect 202a. In view of the above, for the direction along the line IIb-IIb' in FIG. 2A, even when a deviation from precise alignment is caused in the formation of the via 203a, the via 203a is never located outside the local interconnect 202a. This ensures electrical connection through the local interconnect 202a between the via 203a and the element-to-element connection lower interconnect 201b.

The local interconnect 202a and the element-to-element connection lower interconnect 201a need only be spaced the distance S22 apart from each other to prevent a short circuit therebetween even with a deviation from precise alignment. The distance between the local interconnect 202a and the element-to-element connection lower interconnect 201a does not need to be specified as the minimum interconnect-to-interconnect distance. The formation of local interconnects 202 eliminates the need for changing the distance between adjacent ones of element-to-element connection lower interconnects 201. This prevents the LSI area from increasing.

In the known semiconductor device illustrated in FIG. 5, each of vias 52 has been formed a predetermined distance, i.e., a margin, behind one end of associated one of the element-to-element connection lower interconnects. On the other hand, for the semiconductor device of this embodiment, such a margin does not need to be provided. More particularly, as illustrated in FIGS. 2A and 2C, the vias 203a and 203b are formed on one ends of the element-to-element connection lower interconnects 201b and 201d, respectively. Consequently, in particular, as illustrated in FIG. 2C, the distance between the vias 203a and 203b is the same as the distance S23 between the element-to-element connection lower interconnect 201b and 201d, and this distance can be set at the patternable minimum interconnect-to-interconnect distance.

The formation of the local interconnects 202 eliminates the need for allowing the element-to-element connection lower interconnects 201 to outwardly project beyond the locations where the vias 203 are to be formed. Therefore, a plurality of vias 203 can be formed closer to each other than in the known art. In view of the above, the LSI area can be reduced.

When each via 203 is formed to deviate toward one end of one of the element-to-element connection lower interconnects 201 opposed to another thereof corresponding to the via 203 (for example, the via 203a is formed to deviate toward the element-to-element connection lower interconnect 201d), the via 203 is partly located outside associated one of the local interconnects 202. However, since an adequate margin is provided to compensate for a deviation from precise alignment in the direction orthogonal to the direction to which the via 203 deviates (along the line IIb-IIb'), this ensures electrical connection between the local interconnects 202 and the vias 203.

Even with a deviation from precise alignment of the element-to-element connection lower interconnect 201b along the length direction thereof, a deviation from precise alignment thereof in the opposite direction to the direction going toward the element-to-element connection lower interconnect 201d can be coped with in the manner in which a margin is provided by extending the local interconnect 202a toward the above-mentioned opposite direction.

As described above, according to the semiconductor device of this embodiment, the formation of each of local interconnects 202 ensures margins for compensating for deviations from precise alignment between element-to-element connection lower interconnects 201 and vias 203. This can certainly provide electrical connection between the element-to-element connection lower interconnects 201 and the vias 203. This eliminates the need that the element-to-element connection lower interconnects 201 extend a predetermined distance beyond the vias 203. As a result, the degree of integration of LSIs can be increased, and the LSI area can be reduced.

As described in the first embodiment, each of local interconnects 202 can be formed to extend over the associated element-to-element connection lower interconnect 201, thereby reinforcing the element-to-element connection lower interconnect 201. This can achieve an increase in the reliability of the element-to-element connection lower interconnects 201 and a reduction in the resistance thereof.

When a single local interconnect 202 is formed to cover a plurality of element-to-element connection lower interconnects 201, this allows electrical connection among the plurality of element-to-element connection lower interconnects 201 without interposing vias between the local interconnect 202 and the element-to-element connection lower interconnects 201 and complicating the shapes of the element-to-element connection lower interconnects 201. This can simplify patterns of element-to-element connection lower interconnects 201 and other interconnects. The simplification of the patterns suppresses rounding and improves the patterning accuracy. As a result, variations among interconnects in finished shape can be suppressed. Furthermore, margins for compensating for deviations from precise alignment between the element-to-element connection lower interconnects and the vias can be reduced.

Figure 6:
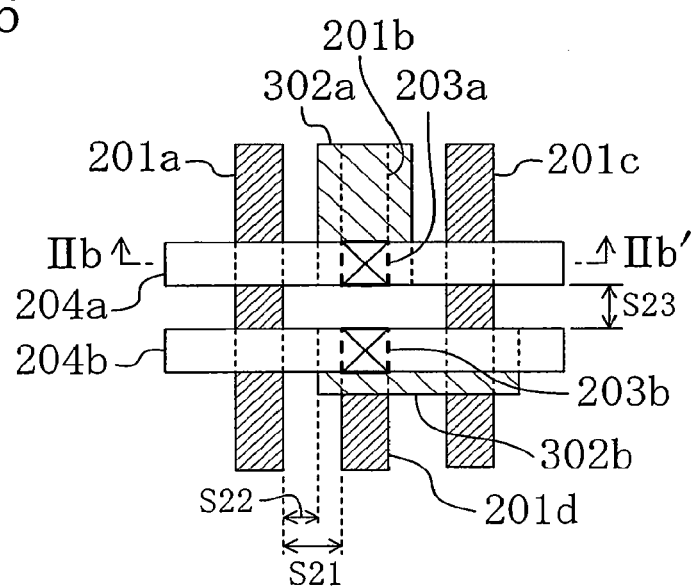
FIG. 6 corresponds to the embodiment of FIG. 2 and illustrates how local interconnects reinforce an element-to-element connection.

FIG. 6 illustrates a local interconnect 302a reinforcing an element-to-element connection lower interconnect 201b and a local interconnect 302b providing electrical connection between an element-to-element connection lower interconnect 201c and an element-to-element connection lower interconnect 201d. In FIG. 6, the other components are the same as those in FIG. 2A, and thus a detailed description thereof is not given.

In view of the above, the degree of integration of LSIs can be increased, the LSI area can be reduced, and the reliability of LSIs can be improved. Consequently, the speed at which LSIs operate can also be increased.

A single semiconductor device may have a structure obtained by combining the structure of the semiconductor device of this embodiment having the above-mentioned local interconnects 203 with the structure of the known semiconductor device (that is not provided with the local interconnects 203). The local interconnects 203 may be used only to provide electrical connection between associated ones of the element-to-element connection lower interconnects 201 or only to reinforce the element-to-element connection lower interconnects 201.

Next, a fabrication method for a semiconductor device of this embodiment will be described with reference to FIGS. 2A through 2C. First, an interlayer dielectric 205 is formed on a substrate formed with, for example, MOS transistors by CVD or any other method. Next, openings for forming element-to-element connection lower interconnects 201 are formed in the interlayer dielectric 205 by a lithography process or any other process and then filled with an interconnect metal, such as copper. In this way, element-to-element connection lower interconnects 201 (201a, 201b, 201c, and 201d) are formed.

Subsequently, an interlayer dielectric 206 is formed on the interlayer dielectric 205 by CVD or any other method to cover the element-to-element connection lower interconnects 201. Next, openings for forming local interconnects 202 are formed in the interlayer dielectric 206 by a lithography process or any other process and then filled with an interconnect metal, such as tungsten. In this way, local interconnects 202 (202a and 202b) are formed.

Next, an interlayer dielectric 207 is formed on the interlayer dielectric 206 by CVD or any other method to cover the local interconnects 202. Subsequently, openings for forming vias 203 and element-to-element connection upper interconnects 204 are formed in the interlayer dielectric 207 by a lithography process or any other process and then filled with an interconnect metal, such as copper. In this way, vias 203 (203a and 203b) and element-to-element connection upper interconnects 204 (204a and 204b) are formed.

In the above-mentioned manner, the semiconductor device of this embodiment is fabricated.

What is claimed is:

1. A semiconductor device comprising:
a first gate electrode formed on a substrate;
a second gate electrode formed on the substrate, the second gate electrode being physically separated from the first gate electrode;
a conductive land formed in contact with at least part of a top surface of the first gate electrode; and
a contact formed on the conductive land, the contact being electrically connected through the conductive land to the first gate electrode, wherein:
the conductive land extends over the top surface of the first gate electrode and an area around said top surface and has a larger area than the contact when viewed in plan, and
the first gate electrode and the second gate electrode are electrically connected to each other by contacting at least part of a top surface of said second gate electrode with the conductive land.

2. The semiconductor device of claim 1, further comprising:
a first impurity region formed in an upper portion of the substrate and a first gate insulating film formed on the first impurity region, wherein:
the first gate electrode is formed on the first impurity region with the first gate insulating film interposed therebetween,
the conductive land is a local interconnect in contact with at least part of the top surface of the first gate electrode, and
the contact is formed on the local interconnect.

3. The semiconductor device of claim 1, further comprising:
a first impurity region formed in an upper portion of the substrate and a first gate insulating film formed on the first impurity region,
wherein the first and second gate electrodes are formed on the first impurity region with the first gate insulating film interposed therebetween.

4. The semiconductor device of claim 2, wherein the local interconnect reinforces electrical characteristics of the first gate electrode by extending over the first gate electrode.

5. The semiconductor device of claim 1, further comprising:
a third gate electrode formed on the substrate,
wherein the first gate electrode and the third gate electrode are electrically connected to each other by contacting at least part of the top surface of the third gate electrode with the conductive land.

6. The semiconductor device of claim 2, further comprising:
a second impurity region formed in the upper portion of the substrate and being different from the first impurity region;
a second gate insulating film formed on the second impurity region; and
a third gate electrode formed on the second impurity region with the second gate insulating film interposed therebetween,
wherein the first gate electrode and the third gate electrode are electrically connected to each other by contacting at least part of the top surface of the third gate electrode with the local interconnnect.

7. The semiconductor device of claim 3, further comprising:
a second impurity region formed in the upper portion of the substrate and being different from the first impurity region;
a second gate insulating film formed on the second impurity region; and
a third gate electrode formed on the second impurity region with the second gate insulating film interposed therebetween,
wherein the first gate electrode and the third gate electrode are electrically connected to each other by contacting at least part of the top surface of the third gate electrode with the conductive land.

* * * * *